METHOD OF MAKING HIGH FREQUENCY TRANSISTORS

Filed May 18, 1967

INVENTORS.
FRED BARSON
VIR A. DHAKA
BY Julius B. Kraft
ATTORNEY

United States Patent Office 3,489,622
Patented Jan. 13, 1970

3,489,622

METHOD OF MAKING HIGH FREQUENCY TRANSISTORS

Fred Barson, Wappingers Falls, and Vir A. Dhaka, Poughkeepsie, N.Y., assignors to International Business Machines Corporation, Armonk, N.Y., a corporation of New York Filed May 18, 1967, Ser. No. 639,478
Int. Cl. H01l 7/34
U.S. Cl. 148—187 8 Claims

ABSTRACT OF THE DISCLOSURE

A method of making transistors useful for high frequency applications by forming on the surface of a semiconductor substrate of a first conductivity type a silicon dioxide layer doped with a conductivity determining impurity of opposite type. The doped layer covers only the portions of the surface corresponding to the selected extrinsic base area of the transistor; the intermediate portion of the surface corresponding to the selected intrinsic base area is left uncovered. The extrinsic base is formed by diffusion from the doped layer, and the intrinsic base and the emitter are formed by diffusion through the intermediate uncovered area.

BACKGROUND OF THE INVENTION

Figure 1:
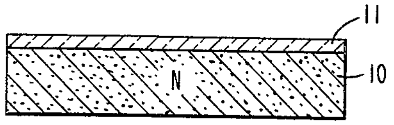

This invention relates to a method for making semiconductor devices, particularly planar microelectronic transistors useful for high frequency applications. Planar microelectronic transistors are characterized by the emergence of the collector, base and emitter regions as well as the collector/base and emitter/base junctions at the surface of the semiconductor substrate. Accordingly, the ohmic contacts to the regions of the transistor may be readily made at the surface. The regions and junctions are conventionally formed by a series of masked diffusion steps. For example, the surface of a semiconductor substrate of a given conductivity type such as a wafer is covered with a non-conductive coating, usually silicon dioxide. Selected areas are removed or opened in the oxide coating by a standard procedure which involves coating the oxide coating with a photosensitive plastic material that polymerizes or hardens whenever it is struck by ultraviolet light. The unexposed areas of the coating may be dissolved and washed away by suitable organic solvents such as xylene to leave a photoresist over the silicon dioxide in the areas which are not to be removed. The areas in the silicon dioxide not covered by photoresist are then etched away with a suitable etching acid to leave a silicon dioxide mask with openings therein in a selected pattern on the semiconductor substrate corresponding to, let us say, the base areas. A conductivity determining impurity of a type opposite to that of the substrate is diffused through the openings into the substrate to form the base regions. Thereafter, in a similar fashion, another oxide mask is formed for the emitter diffusion, that is, a diffusion of a impurity of the same conductivity type as that of the original substrate into the already formed base region, thereby to form the emitter region.

The technique described above lends itself particularly well to so-called integrated circuit configuration. Having formed the transistor devices within the wafer of semiconductor material by means of the controlled diffusion of selected impurities, the oxide mask, which is insulative, may be left on the surface of the wafer and appropriate conducting layers may be formed thereover so as to contact predetermined regions of the embedded devices and to interconnect as desired a plurality of such devices. The term "monolithic" has been applied to this integrated circuit approach.

According to another solid state circuit fabrication method the multiplicity of transistor devices as formed by the described planar technique are simply cut from the semiconductor wafer into so-called device "chips." These "chips" are later secured to a circuit board or module and are connected with other circuit components to form one or more complex circuit configurations by means of known printed circuit techniques.

In the components industry, there has been a continual demand for increasing the switching speeds of transistors for high frequency applications. The art has recognized that the frequency response of a transistor is limited by the time delay associated with the conduction of current carriers across the base region of the transistor from the emitter/base junction to the base/collector junction. Because this time delay is affected by the base width, it has been recognized that the transit time for current carriers across the base region may be reduced by making the base width very narrow during the fabrication of the transistor.

In order to fabricate such narrow base width transistors and avoid the problem of punch-through, the trend in the transistor fabrication art has been in the direction of shallow base diffusion transistors. However, the shallow base diffusions give rise to the attendant high resistance in the extrinsic areas of the base which are the remaining regions of the base extending from the intrinsic or active areas of the base to the ohmic contacts of the base. Such high extrinsic base resistances are very undesirable because high switching speed transistors require a very low resistance path from the active or intrinsic base areas to the ohmic contacts through the extrinsic base areas.

In an attempt to solve this problem, the art has formed the intrinsic and extrinsic base areas in separate and independent diffusions. Such diffusion processes are disclosed in U.S. Patent 3,305,913 and copending application Ser. No. 520,621 filed Jan. 14, 1966. In the processes of each of these disclosures, the extrinsic base areas are first formed by diffusion through openings in a silicon dioxide mask into a semiconductor substrate having a given conductivity type. An impurity of opposite conductivity determining type is diffused through the openings in the relatively high concentration and to the depth required to give desirable low resistance of the extrinsic base. Then, the entire substrate surface is again covered with silicon dioxide and a second mask is formed by the conventional photoresist exposure and etch technique, in which the opening of the mask must be in registration with the area in the substrate intermediate the previously diffused extrinsic base area which intermediate area is to be the intrinsic base. Then, the intrinsic base is formed by diffusion through the opening of the same impurity as that of the extrinsic base but of the lower concentration and a shallower depth, desirable in the intrinsic base, after which the emitter is formed by diffusing through the same opening an impurity of the same conductivity type as that of the original substrate into the intrinsic base region to a depth leaving the narrow intrinsic base area.

While the processes described represent a very valid approach toward the solution of the problem of forming intrinsic and extrinsic bases having widely varying parameters, the practice of these processes has been hampered by the problem of mask alignment. It is very difficult in the formation of the second silicon dioxide mask used for the intrinsic base and emitter diffusion to provide a hole in substantially precise registration with the undiffused area intermediate the diffused extrinsic base which is to be the intrinsic base. In microelectronic transistor fabrication, the hole through which the intrinsic base diffusion is to be made has dimensions in the order of 0.1 mils. Thus, even minute deviations of the hole in the mask from registration are often sufficient to result in either intrinsic bases rendered ineffectual by their low resistance or undesirable high resistance paths to the ohmic contacts through the extrinsic bases.

SUMMARY OF INVENTION

The present invention provides a method of transistor fabrication in which the extrinsic and intrinsic bases are formed in independent diffusions without any remasking between the extrinsic and intrinsic base diffusions. Accordingly, all of the problems associated with mask alignment to bring a mask hole having dimensions in the order of 0.1 mils or less into registration with the intrinsic base areas intermediate the diffused extrinsic base areas are eliminated.

In accordance with the present invention, there is formed on the surface of a semiconductor substrate of a first conductivity type, a layer of silicon dioxide doped with a conductivity determining impurity of opposite type in a pattern corresponding to the selected extrinsic base area of the transistor. The surface is left uncovered in the intermediate area corresponding to the selected intrinsic base area. Preferably, the above pattern is formed by covering the surface with a mask of non-conductive material such as undoped silicon dioxide having an opening or hole corresponding to the entire selected base area. Then, the doped silicon dioxide layer is formed in the opening. A hole is next opened in the doped silicon dioxide corresponding to the selected intrinsic base area. The doped silicon dioxide layer used may be formed in the manner indicated in U.S. Patents 2,802,760 and 3,200,019 which describe diffusions from doped silicon dioxide.

At this point in the process, no region has been formed by diffusion. Yet, from this point on, no further remasking is needed to complete the fabrication of the transistor. The extrinsic base is formed by heating to diffuse the impurity from the doped silicon dioxide layer into the substrate in the areas beneath the layer to a depth and concentration yielding the desired extrinsic base electrical characteristics. Independently, the intrinsic base is formed by diffusing into the intermediate uncovered portion of the substrate a conductivity determining impurity of the same type as that diffused into the extrinsic base but to a depth and concentration yielding the selected intrinsic base electrical characteristics which in the case of a high frequency transistor would preferably be a shallower depth and lower surface concentration than the extrinsic base diffusion.

Likewise, the emitter is formed by diffusing through the same opening an impurity of the same conductivity type as that of the original substrate into the intrinsic base region to a lesser depth than the intrinsic base.

THE DRAWINGS

FIGURES 1 through 7 are cross-sectional views diagrammatically illustrating the steps to be followed in the fabrication of a transistor in accordance with a preferred embodiment of the present invention.

PREFERRED EMBODIMENTS

Figure 2:
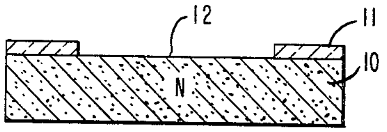
Figure 3:
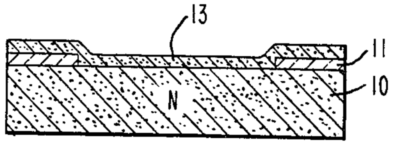
Figure 4:
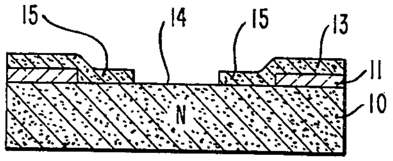

Referring to FIG. 1, a semiconductor substrate such as a silicon wafer 10 of a first conductivity type, e.g. N-type, is coated with a non-conducting coating such as silicon dioxide layer 11. Then, using the standard photoresist and acid etch techniques known in the art, a hole 12 is formed in silicon dioxide layer which corresponds to the area in the substrate selected to be the entire base of the transistor being fabricated as shown in FIG. 2. Next, as in FIG. 3, a silicon dioxide layer 13 doped with a conductivity determining impurity of a type opposite to the conductivity type of the substrate 10 is desposited in hole 12. In the case of an N-conductivity type substrate, the dopant in layer 13 is a P-type impurity such as boron. Layer 13 may be deposited in accordance with the procedure of U.S. Patent 3,200,019 at a temperature preferably below 900° C. which is sufficiently low so there is substantially no diffusion from layer 13 into the substrate at this stage. Alternatively, the doped silicon dioxide layer may be formed from a solution containing the impurity by an anodic oxidation technique. Then, as shown in FIG. 4, by the standard photoresist and etch techniques, hole 14 is opened in layer 13 over an area corresponding to the selected intrinsic base area in the transistor being fabricated. Hole 14 is intermediate area 15 in doped layer 13 which area corresponds to the selected extrinsic base area in the transistor. At this stage, before there has been any diffusion to form the extrinsic base, intrinsic base or emitter, the final masking arrangement is present; there will be no need for subsequent remasking.

Figure 5:
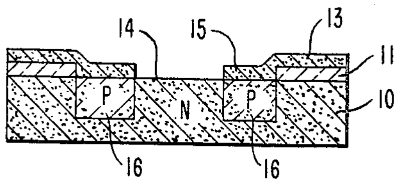
Figure 6:
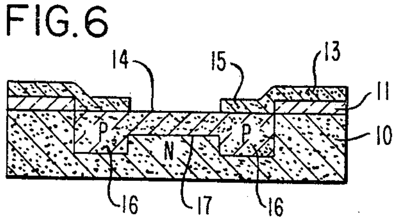
Figure 7:
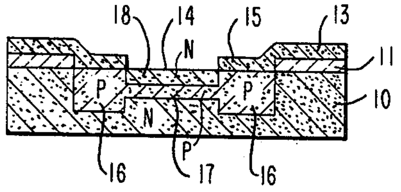

The extrinsic base 16 having a relatively high concentration of the P-type impurity, FIG. 5, is then formed by heating the substrate to a temperature of about 1000° C. for a period of 30 minutes to diffuse the boron from doped silicon areas 15 into the substrate. The intrinsic base 17, FIG. 6, is then formed by diffusing the P-type impurity, boron, through hole 14 by any conventional diffusion technique. For example, a sealed tube or capsule type diffusion may be carried out in which the masked substrate is placed in an evacuated sealed tube containing a boron doped silicon source. The capsule is maintained at 1000° C. for a period of 1 hour. Intrinsic base 16 has a relatively low impurity concentration. Emitter 18, FIG. 7 is then formed by a second diffusion through hole 14. An N-type impurity such as phosphorus is diffused by a conventional open-tube technique. Typically, the masked substrate is placed in a furnace in which a source of phosphorus, $P_2O_5$ is maintained at 300° C. and the substrate is maintained at 900° C. for a period of 12 minutes while a carrier gas carries the phosphorus into contact with the substrate. Ohmic contacts (not shown) may be then applied at the surface of the substrate, to emitter 18, to extrinsic base 16 through layer 15 in the conventional manner and to collector region 10 through layers 11 and 13.

While the diffusion to form the extrinsic base has been a step preceding the intrinsic base and emitter diffusions, it should be noted that the extrinsic base diffusion from doped mask 13 may be carried out simultaneously with the diffusion of the intrinsic base and with the emitter diffusion.

Depending on the diffusion technique used to form the intrinsic base, it is possible that a light solid coating will form over hole 14. For example, techniques using open tube diffusion to form the intrinsic base may result in the formation of such a light coating. This light coating may be readily removed, before the emitter diffusion, without the need for remasking, merely by dipping the substrate in a dilute acid etch which leaves the thicker layer 13 substantially unaffected. While the examples of typical techniques for the formation of the intrinsic base and emitter have been vapor diffusion techniques, it should be clear that other diffusion techniques may be used including diffusion from solids. For example, silicon dioxide doped with the desired impurity may be deposited as a layer in hole 14 in either the formation of the intrinsic base or emitter. The concentration of the impurity in the doped silicon dioxide, the thickness of the doped layer deposited and the time and temperature of the diffusion step may be controlled in a known manner to provide the desired intrinsic base characteristics e.g., the shallower diffusion, narrow width intrinsic base of low impurity concentration.

Where the intrinsic base is formed by diffusion from a doped silicon dioxide coating in hole 14, this coating must of course be removed from hole 14 before the diffusion of the emitter. This is facilitated because the relatively shallow, low impurity concentration intrinsic base diffusion requires only a relatively thin doped silicon dioxide coating in hole 14. This thin coating may be removed by dipping in a dilute acid etch which is sufficient to remove the coating from hole 14 without affecting the masking properties of mask 13.

In the formation of the intrinsic base and emitter by certain vapor diffusion techniques, such as "closed-tube" diffusions, layer 13 may evidence a tendency to free some of its boron dopant into the ambient. Such freed boron may produce an undesirable alteration of the impurity content of the ambient. Also, during the diffusion of the extrinsic base, layer 13 may tend to free boron dopant into the ambient. This tendency may be avoided by forming a protective coating of undoped silicon dioxide over doped layer 13. If such a protective coating is to be used, it is best applied to layer 13 at the stage shown in FIG. 3. The coating should be applied at a temperature below 900° C. to insure against any premature diffusion into the substrate from layer 13. Pyrolytic deposition or sputtering are among the standard methods utilizable to apply such a coating at low temperature. Then, when hole 14 is formed, it will be etched through both layer 13 and its protective coating.

Where the effect of freed boron dopant is a problem primarily during extrinsic base diffusion, the effect many be avoided by forming a thin layer of silicon dioxide over hole 14 by any low temperature technique including pyrolytic deposition, sputtering or anodization. This thin layer may be readily removed prior to intrinsic base diffusion by a dilute acid etch as previously described.

While the invention has been particularly shown and described with reference to the preferred embodiments thereof, it will be understood by those skilled in the art that various changes in form and detail may be made therein without departing from the spirit and scope of the invention.

What is claimed is:

1. A method of fabricating a transistor comprising:
- forming on the surface of a semiconductor substrate of a first conductivity type a layer of silicon dioxide doped with a conductivity determining impurity of opposite type covering portions of the surface in a pattern corresponding to the selected extrinsic base area of the transistor and leaving uncovered the intermediate portion corresponding to the selected intrinsic base area;
- forming the extrinsic base by heating the coated substrate to diffuse said impurity from said layer into the substrate in the area beneath the layer to a depth and concentration providing the selected extrinsic base electrical characteristics;
- forming the intrinsic base by diffusing into the intermediate uncovered portion of said surface a conductivity-determining impurity of said opposite type to a depth and concentration providing the selected intrinsic base electrical characteristics; and
- diffusing into the same intermediate uncovered portions, a conductivity-determining impurity of said first conductivity type to lesser depth than said intrinsic base to provide the emitter.

2. The method of claim 1 wherein the impurity diffusion in the intrinsic base is to a shallower depth than the diffusion in the extrinsic base.

3. The method of claim 1 wherein the impurity in the intrinsic base has a lower surface concentration than the impurity in the extrinsic base.

4. The method of claim 2 wherein the impurity in the intrinsic base has a lower surface concentration than the impurity in the extrinsic base.

5. The method of claim 1 wherein the intrinsic base is formed by vapor diffusion.

6. The method of claim 1 wherein the emitter is formed by vapor diffusion.

7. The method of claim 1 wherein the layer of doped silicon dioxide is formed on said surface by
- forming an undoped oxide coating on said surface;
- removing part of the oxide coating to uncover the surface in the area corresponding to the selected enitre base area;
- coating the uncovered surface with a layer of the doped silicon dioxide; and
- removing the portion of the doped silicon dioxide corresponding to the selected intrinsic base area.

8. The method of claim 7 wherein an undoped silicon dioxide coating is applied over the doped silicon dioxide layer and then that portion of said coating covering the removed doped silicon dioxide is removed together with the doped silicon dioxide layer.

References Cited

UNITED STATES PATENTS

| | | | |
|---|---|---|---|
| 3,312,881 | 4/1967 | Yu | 148—186 |
| 3,389,023 | 6/1968 | Langdon | 148—187 |

OTHER REFERENCES

Applicant's Non Pat. Citations, W. Munch, Depositing Doped Silicon Dioxide Layers. In IBM Technical Disclosure Bulletin. vol. 9, No. 5 October 1966.

L. DEWAYNE RUTLEDGE, Primary Examiner

R. A. LESTER, Assistant Examiner

U.S. Cl. X.R.

29—578; 148—188